United States Patent [19]

Oto

[11] Patent Number: 4,527,180

[45] Date of Patent: Jul. 2, 1985

[54] MOS VOLTAGE DIVIDER STRUCTURE SUITABLE FOR HIGHER POTENTIAL FEEDBACK REGULATION

[75] Inventor: Duane Oto, Santa Clara, Calif.

[73] Assignee: Intel Corporation, Santa Clara, Calif.

[21] Appl. No.: 462,192

[22] Filed: Jan. 31, 1983

[51] Int. Cl.[3] .................. H01L 27/04; H01G 4/38; H02M 5/08

[52] U.S. Cl. .................. 357/23.6; 357/51; 357/59; 361/328

[58] Field of Search .............. 357/23 C, 59, 51; 323/364; 361/328, 330

[56] References Cited

U.S. PATENT DOCUMENTS

| | | | |
|---|---|---|---|
| 1,899,176 | 2/1933 | Bailey | 361/330 |
| 2,944,198 | 7/1960 | Louys | 323/364 |
| 4,033,506 | 7/1977 | Braun | 361/228 |
| 4,246,502 | 1/1981 | Kubinec | 357/59 |
| 4,419,812 | 12/1983 | Topich | 357/51 |

FOREIGN PATENT DOCUMENTS 436128 10/1935 United Kingdom ............... 361/330

OTHER PUBLICATIONS

McCreary et al.; IEEE Journal of Solid-State Circuits; vol. SC-10; No. 6; Dec. 1975; pp. 371-379.

Hodges et al.; IEEE Journal of Solid-State Circuits; vol. SC-13; No. 3; Jun. 1978; pp. 285-294.

Primary Examiner—William D. Larkins
Assistant Examiner—Andrew J. Telesz, Jr.
Attorney, Agent, or Firm—Blakely, Sokoloff, Taylor & Zafman

[57] ABSTRACT

An MOS voltage divider is described which is particularly useful for dividing a relatively high voltage (e.g., 21 volts). Capacitance division is employed, thus, the divider consumes substantially no current. Capacitors are fabricated from first and second layers of polysilicon and an intermediate layer of silicon dioxide. Common centroid geometry is used to compensate for process variations.

10 Claims, 4 Drawing Figures

MOS VOLTAGE DIVIDER STRUCTURE SUITABLE FOR HIGHER POTENTIAL FEEDBACK REGULATION

BACKGROUND OF THE INVENTION

1. Field of the Invention

The invention relates to the field of passive voltage dividers for MOS integrated circuits.

2. Prior Art

In some metal-oxide-semiconductor (MOS) integrated circuits a higher potential than the normal power supply potential (e.g., 5 volts) is required. This higher potential may be generated on-chip using charge pumping circuits. On-chip regulation of this higher potential is difficult, particularly if power dissipation is to be minimized. The higher potential, for instance, is required for the programming and erasing of electrically programmable and electrically erasable memory ($E^2$) cells employing floating gates. Such cells are described in U.S. Pat. No. 4,203,158. (A circuit for switching of these higher voltages is described in copending application, Ser. No. 339,790 filed Jan. 14, 1982, entitled "MOS HIGH VOLTAGE SWITCHING CIRCUIT", which is assigned to the assignee of the present invention now U.S. Pat. No. 4,451,748.) To reduce wear-out of junctions in $E^2$ cells, particularly those employing thin oxides, the higher potential should be regulated (e.g., 21 volts).

Enhancement mode devices can be used to regulate this higher potential where these devices are connected in a diode-like configuration. While this circuit provides good power conservation, it is not temperature stable. Another known circuit for providing regulation employs the grounded gate breakdown potential of diffusions in MOS devices. This circuit is not temperature stable and is very process dependent. In still another circuit for regulating the higher potential a feedback loop is used. As will be seen, the voltage divider of the present invention is employed in a feedback loop and is used to control the higher programming potential for $E^2$ memory cells.

There are many prior art MOS circuits used for voltage division. Most typically, the circuits employ series coupled transistors or resistors fabricated, for instance, from diffused regions. These circuits consume too much power to be useful in some applications such as the application described in this patent, in other cases these prior art circuits cannot handle a high potential (e.g., 21 volts).

SUMMARY OF THE INVENTION

A voltage divider for use in an MOS integrated circuit formed on a silicon substrate is described. First and second polysilicon members insulated from the substrate are formed from a first layer of polysilicon. Third and fourth polysilicon members formed from a second layer of polysilicon are formed above and insulated from the first and second members. The third polysilicon member is disposed over a portion of both the first and second polysilicon members so as to provide capacitances between the third member and the first and second members. The fourth polysilicon member is disposed above the second polysilicon member and provides capacitance between the second and fourth members. The third polysilicon member is completely surrounded by silicon dioxide and thus is electrically floating. The divider provides accurate division, with substantially no power consumption, and moreover, the voltage divider is very insensitive to process variations and temperature changes.

DETAILED DESCRIPTION OF THE PRESENT INVENTION

A voltage divider formed as part of an MOS integrated circuit employing capacitance division is described. In the following description numerous specific details are set forth, such as specific layer thicknesses, in order to provide a thorough understanding of the present invention. It will, however, be obvious to one skilled in the art that the present invention may be practiced without these specific details. In other instances, well-known circuits and processes have not been described in detail in order not to unnecessarily obscure the present invention.

The voltage divider of the present invention is used in a feedback loop of a voltage regulation circuit. In its presently preferred embodiment, the voltage divider divides the input voltage by a factor of 6. It will be apparent to one skilled in the art that the described voltage divider may be employed in other applications and may provide voltage division in other ratios.

Figure 1:
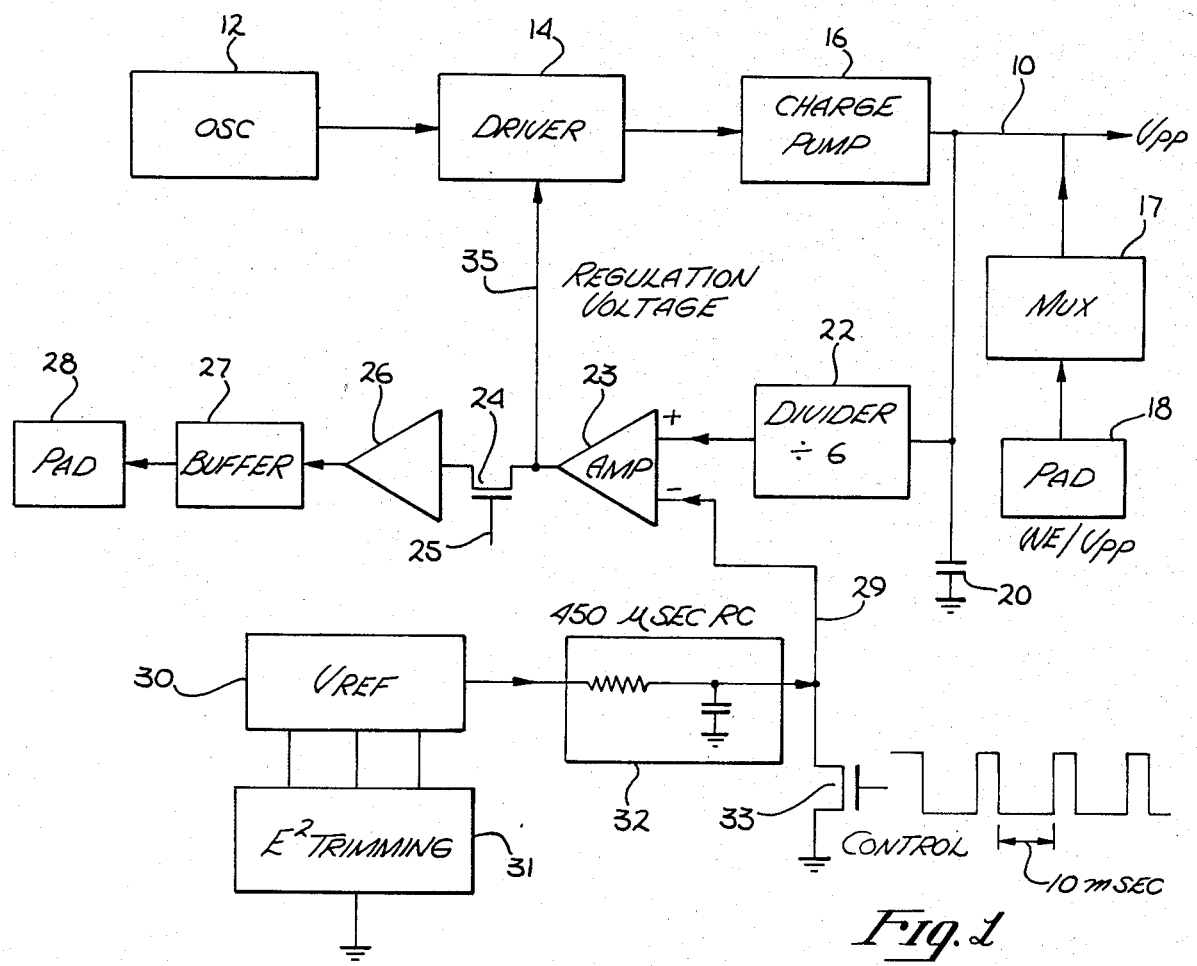
FIG. 1 is a block diagram of a high voltage generation and regulation circuit which employs the voltage divider of the present invention.

Referring first to FIG. 1, the voltage generation and regulation circuit provides a high potential (e.g., 21 volts) on line 10. The circuit is powered from a 5 volt potential in the presently preferred embodiment. As previously mentioned, the circuit of FIG. 1 is included as part of an $E^2$ memory, the $V_{pp}$ potential being used to program and erase the $E^2$ cells.

A free running oscillator 12 which in the presently preferred embodiment operates at a frequency of 10 MHz is coupled through a driver circuit 14. The magnitude of the high frequency output from the driver 14 is controlled by the regulation voltage on line 35. This output drives an ordinary charge pumping circuit 16 to provide the high voltage on line 10 and capacitor 20. In the presently preferred embodiment, charge pump 16 uses 8 stages with relatively large capacitance in each stage and 2 charge pumping circuits operating on opposite phases of a clocking signal to provide a smoother output. The high potential output is divided by 6 through divider 22, this divider being the subject of the present invention. The output of divider 22 is compared with a reference potential from line 29 in the differential amplifier 23. The output of this amplifier, line 35, provides the regulation voltage which assures that $V_{pp}$ remains at a constant potential.

The reference potential (line 29) is developed by the $V_{ref}$ circuit 30 employing ordinary circuits. The output of circuit 30 is passed through an RC circuit 32 which in the presently preferred embodiment has a time constant of approximately 450 μsec. When the control signal is applied to the gate of transistor 33, the potential on line 29 is ramped to the $V_{ref}$ potential (e.g., 3 volts) causing the $V_{pp}$ to ramp to 21 volts. The potential is ramped since it provides better programming and erasing for the $E^2$ cells. In the presently preferred embodiment, the duration of the high voltage pulses on line 20 is approximately 10 msec., as determined by the externally applied control signal since this provides ideal programming and erasing for the $E^2$ cells.

After the circuit of FIG. 1 is initially fabricated, it is "trimmed". During trimming the charge pump 16 is disabled and a potential of $V_{pp}$ is coupled to line 10 through pad 18 and a multiplexer 17. (During normal operation of the memory, pad 18 is used for the write enable signal.) This externally generated $V_{pp}$ signal used during trimming is accurately adjusted to the desired $V_{pp}$ potential. This potential is divided through the divider 22 and compared with the reference potential within the amplifier 23. During trimming, a potential is applied to the gate 25 of transistor 24 and, consequently, the output of the amplifier 23 can be sensed through the sense amplifier 26 and buffer 27 at pad 28. A plurality of $E^2$ cells (or other programmable cells) within the $E^2$ trimming circuit 31 are now programmed adjusting the reference potential until the potential at pad 28 is nulled. This trimming compensates for process variations and other variations within the circuit and assures that during normal circuit operation, the potential on line 10 will be equal to the desired $V_{pp}$ potential.

As can be seen in FIG. 1, the divider 22 plays an important role in the feedback loop of the regulation circuit. Unless this divider provides a constant division of the potential on line 10, good regulation will not result. Moreover, it is important in integrated circuits that the divider 22 not consume any significant power from line 10. Consumption of power from line 10 requires that the charge pump 16 be larger, thereby consuming additional, costly, substrate area. It should also be noted that the divider 22 must be able to handle the higher $V_{pp}$ potential. This requirement eliminates some commonly used circuits.

Figure 2:
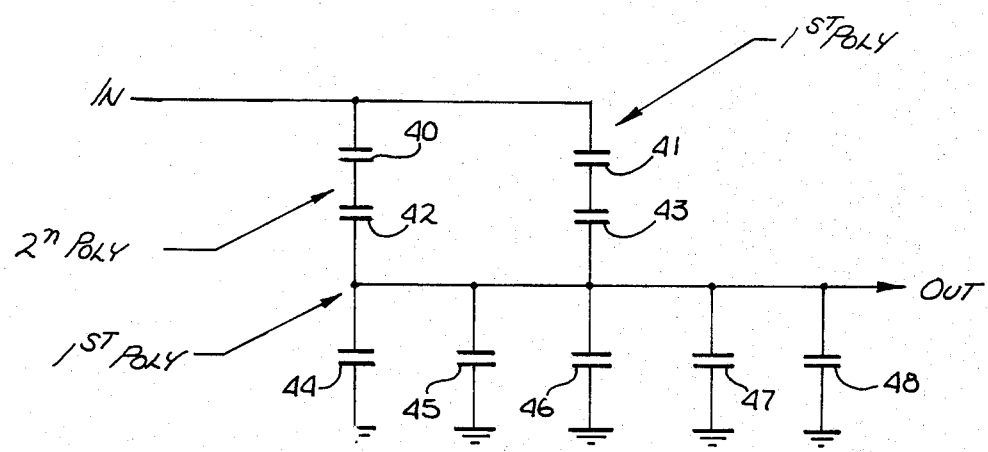
FIG. 2 is an equivalent circuit of the voltage divider of the present invention.

The divider of the present invention employs capacitance division in a unique structure which is substantially insensitive to process variations including masking misalignments and process variations. Referring to FIG. 2, the equivalent circuit of the divider can be represented as 9 capacitors 40 through 48. The input potential is applied to capacitors 40 and 41 and these capacitors are coupled in series with capacitors 42 and 43, respectively. Capacitors 42 and 43 are coupled to capacitors 44 through 48, capacitors 44 through 48 are connected in parallel. If each of the capacitors 40 through 48 have equal capacitance, the input voltage is divided by 6 when sensed on the output line. As will be seen, each of the capacitors of FIG. 2 are formed by polysilicon layers and an intermediate silicon dioxide layer. The input line and the capacitor plates associated with this line and the output line and the capacitor plates associated with that line are formed from a first layer of polysilicon. The plates between capacitors 40 and 42, and capacitors 41 and 43, as well as the grounded plates of capacitors 44 through 48 are formed from a second layer of polysilicon.

Figure 3:
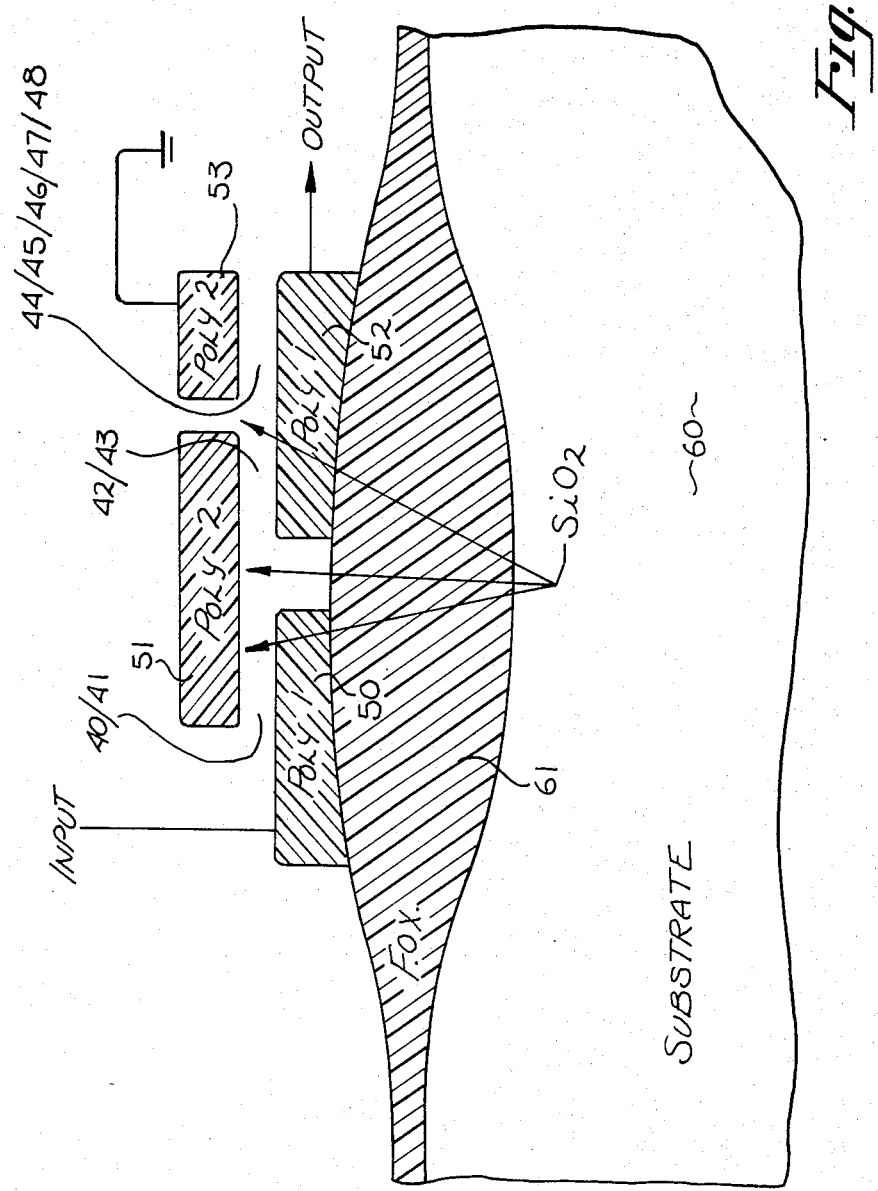
FIG. 3 is a cross-sectional elevation view of a substrate showing the general overlapping of polysilicon members used to form the voltage divider of the present invention.

In the presently preferred embodiment, the divider is fabricated on a silicon substrate employing ordinary well-known MOS processing techniques. As presently realized, the divider is fabricated over a field-oxide region 61 formed on the substrate 60 (FIG. 3). Polysilicon members 50 and 52 are formed over the field-oxide 61. The input potential is coupled to the polysilicon member 50 and the output potential is sensed at the polysilicon member 52. As presently preferred, after a first layer of polysilicon is deposited over the substrate, an oxide layer of approximately 800A is grown on the first layer of polysilicon and then using an ordinary masking and etching step, the polysilicon members 50 and 52 are formed from this first layer of polysilicon. Then a second layer of polysilicon is deposited over the silicon dioxide layer and the polysilicon members 51 and 53 are fabricated from this second layer of polysilicon. The polysilicon member 51 overlaps both the polysilicon members 50 and 52 and the polysilicon member 53 overlaps the polysilicon member 52.

Relating the equivalent circuit of FIG. 2 to the structure of FIG. 3, the capacitors 40 and 41 are defined by the overlapping portions of the polysilicon members 50 and 51 and the intermediate oxide, the capacitors 42 and 43 by the overlapping portions of the poysilicon members 51 and 52 and the intermediate oxide, and the capacitors 44,45,46,47 and 48 by the overlapping portions of the polysilicon members 52 and 53 and the intermediate oxide. It should be noted from the structure of FIG. 3 that the polysilicon member 51 is entirely surrounded by oxide after a passivation layer is formed over the integrated circuit, and thus this member is electrically isolated (no connections).

Figure 4:
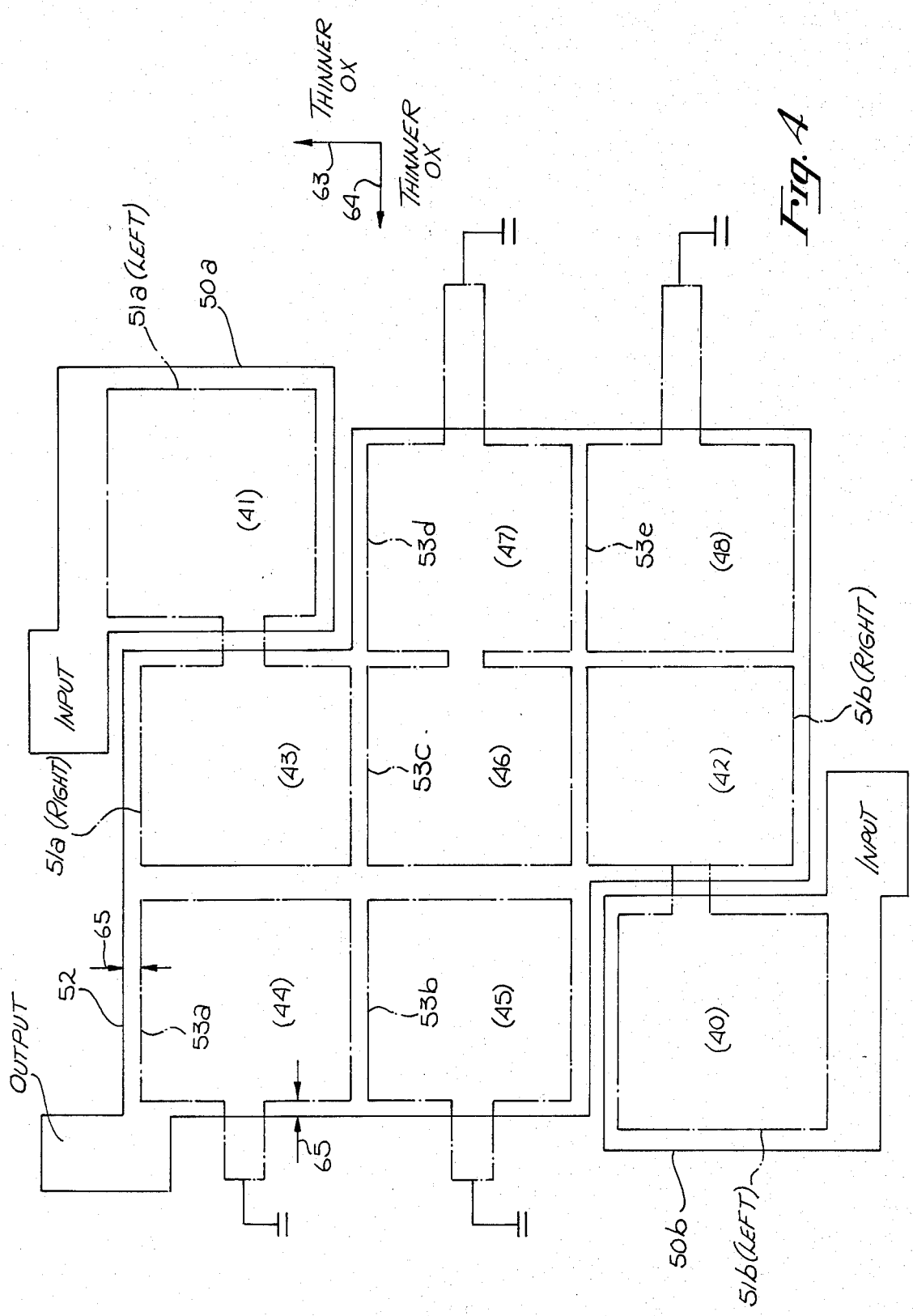
FIG. 4 is a plan view of the presently preferred embodiment of the present invention.

In the preferred embodiment of the divider, common centroid geometry is employed in the layout of the structure. This geometry as shown in FIG. 4 provides compensation for gradients in oxide thickness as well as masking misalignments. In FIG. 4, the outline of the members formed from the first layer of polysilicon is shown in solid lines whereas the outlines of the members formed from the second layer of polysilicon is shown in broken lines. The member 50 of FIG. 3 is formed as two generally square members 50a and 50b, both of which receive the input signal. The member 52 of FIG. 3 is realized as a general square member with opposite corners removed.

Referring to FIG. 3, the left portion of member 51 (disposed above member 50) is labeled 51a (left) and 51b (left) in FIG. 4. These members are disposed above and within the outline of members 50a and 50b. The right portion of member 51 of FIG. 3 (disposed above member 52) is realized in FIG. 4 as members 51a (right) and 51b (right), two generally square members both of which are formed above and within the outline of member 52. Note member 51a (right) is connected to member 51a (left) and member 51b (right) is connected to member 51b (left).

The member 53 of FIG. 3 is realized as five generally square members in FIG. 4, members 53a through 53e. Members 53a, 53b, 53d, and 53e are connected directly to ground whereas member 53c is connected to member 53d and thus is grounded through member 53d.

With the common centroid geometry of FIG. 4, variations in oxide thickness do not cause the divider to divide by other than a factor of 6. Each of the capacitors of FIG. 2 are realized in such spaced-apart orientation as to compensate for gradients in oxide thickness. For instance, if it is assumed that there are gradients in oxide thickness in both orthogonal directions as indicated by arrows 63 and 64 of FIG. 4, division by a factor of 6 still occurs. Since capacitors 41 and 43 are formed in opposite corners of the general square structure from capacitors 40 and 42 the difference in oxide thickness is compensated for. Similarly, capacitors 44, 45, 46, 47 and 48 are distributed within the general square structure of FIG. 4 so as not to effect the design output potential of the divider.

It should be noted from FIG. 4 that the members formed from the second layer of polysilicon fall within the outline of the members formed from the first layer of polysilicon as shown by dimension 65 of FIG. 4. Provided masking misalignments are no greater than dimension 65, the capacitance of the various capacitors formed are not effected by masking misalignments.

For the embodiment discussed, the voltage applied across any one of the capacitors is always low enough to prevent significant leakage. (If leakage occurred to member 51, the effective capacitance of the capacitors 40, 41, 42, and 43 would be permanently altered.) In actual tests, it has been determined that leakage to member 51 is sufficiently low to allow excellent operation of the circuit throughout the life of the memory. When the divider is initially fabricated, there may be charge on the member 51. This initial charge is removed by exposing the circuit to ultraviolet radiation.

In examining FIG. 4, it would appear that if the members 50, 51 and 53 each are equal in area a division by six occurs. However, the capacitance between the first layer of polysilicon and the substrate provides a second order effect changing the overall capacitance of the structure. In practice, a division of 5.5 is realized if each of the members 50, 51 and 53 are of equal area. By changing the areas of these members slightly, the first layer of polysilicon to substrate capacitance can be compensated for quite easily.

Thus, a voltage divider employing capacitance division has been described. The divider is realized employing members fabricated from first and second layers of polysilicon and intermediate oxides. The divider can be used to handle a relatively high voltage.

I claim:

1. In a metal-oxide-semiconductor integrated circuit formed on a silicon substrate, a voltage divider comprising:
   a first and a second polysilicon member each insulated from said substrate and from each other;
   a third and a fourth polysilicon member each insulated from each other and from said first and second polysilicon members;
   said third polysilicon member being disposed over a portion of said first and second polysilicon members so as to provide capacitance between said third polysilicon member and said first and second polysilicon members, said third polysilicon member being completely surrounded by insulation;
   said fourth polysilicon member being disposed above said second polysilicon member so as to provide capacitance between said second and fourth polysilicon members;
   said first, second and fourth members being coupled to terminals for said divider;
   whereby said circuit provides a voltage divider between said first and second members.

2. The voltage divider defined by claim 1 wherein said first and second members are fabricated from a first layer of polysilicon and wherein said third and fourth members are fabricated from a second layer of polysilicon.

3. The voltage divider defined by claim 2 wherein said first and second polysilicon members are insulated from third and fourth polsilicon members by a layer of silicon dioxide grown from said first layer of polysilicon.

4. In a metal-oxide-semiconductor integrated circuit formed on a silicon substrate, a voltage divider comprising:
   a first and a second polysilicon member insulated from one another forming a first capacitor;
   a third and a fourth polysilicon member insulated from one another forming a second capacitor,
   said first and second capacitors being spaced-apart from one another, said first and third polysilicon members being formed from a first layer of polysilicon and said second and fourth polysilicon members being formed from a second layer of polysilicon;
   a fifth polysilicon member disposed generally between said first and second capacitors and formed from said first layer of polysilicon;
   a sixth and seventh polysilicon member formed from said second layer of polysilicon and disposed over said fifth polysilicon member, said sixth polysilicon member being connected to said second polysilicon member and said seventh polysilicon member being connected to said fourth polysilicon member; and
   a plurality of eighth polysilicon members formed from said second layer of polysilicon and disposed generally over said fifth polysilicon member,
   whereby a voltage divider is realized.

5. The voltage divider defined by claim 4 wherein said first layer and second layer of polysilicon are separated by an oxide layer.

6. The voltage divider defined by claim 5 wherein said polysilicon members formed from said second layer of polysilicon lie within the outline of said polysilicon members formed from said first layer of polysilicon, thereby compensating for masking misalignments.

7. The voltage divider defined by claim 5 wherein the capacitors formed by said polysilicon members fabricated from said first layer of polysilicon and said polysilicon members fabricated from said second layer of polysilicon are dispersed so as to compensate for variations in thickness of said oxide layer.

8. The voltage divider defined by claim 7 wherein said fifth polysilicon member is a generally square member with opposite corners removed and wherein said first and second capacitors are formed within said opposite corners.

9. The voltage divider defined by claim 8 wherein said second, fourth, sixth, seventh and plurality of eighth polysilicon members each have approximately equal area.

10. The voltage divider defined by claim 9 wherein an input signal to said voltage divider is applied between said first and third polysilicon members and an output signal from said voltage divider is taken from said fifth polysilicon members.

* * * * *